(12) United States Patent
Andreev et al.

(10) Patent No.: US 7,193,905 B1
(45) Date of Patent: Mar. 20, 2007

(54) RRAM FLIPFLOP RCELL MEMORY GENERATOR

(75) Inventors: Alexander Andreev, San Jose, CA (US); Sergei Gashkov, Moscow (RU); Oleg B. Sedelev, Moscow (RU); Andrey Nikitin, Moscow (RU)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 11/259,228

(22) Filed: Oct. 25, 2005

(51) Int. Cl.
*G11C 7/10* (2006.01)
*G11C 7/00* (2006.01)

(52) U.S. Cl. .......................... 365/189.08; 365/189.01; 365/230.01

(58) Field of Classification Search ............ 365/189.08
See application file for complete search history.

(56) References Cited

U.S. PATENT DOCUMENTS

| | | | |
|---|---|---|---|
| 5,079,694 A | * | 1/1992 | Nakagawa et al. ......... 711/165 |
| 2006/0028897 A1 | * | 2/2006 | Vernenker et al. ..... 365/230.01 |

* cited by examiner

*Primary Examiner*—Son L. Mai
(74) *Attorney, Agent, or Firm*—Luedeka, Neely & Graham, P.C.

(57) ABSTRACT

An RRAM flip-flop rcell memory of the type having a write address decoder, a read address decoder, a set of n flip flops, one AND gate associated with each flip flop in the set, a set of w OR gates where each of the w OR gates in the set has n inputs, the improvement comprising only one write address decoder, and replacing the read address decoder and the set of AND gates and the set of OR gates with no more than one multiplexor, thereby providing a reduction in a path length from an rcell memory input to an rcell memory output and thereby improving timing of the rcell memory, while reducing fanout size of the rcell. In a preferred embodiment, the multiplexor includes fewer than w OR gates, and fewer than n AND gates, and two decoders, which are commonly connected to outputs of the n flip flops.

2 Claims, 5 Drawing Sheets

RRAM FLIPFLOP RCELL MEMORY GENERATOR

FIELD

This invention relates to the field of integrated circuit fabrication. More particularly, this invention relates to a method for generating RRAM flip-flop memory that creates flip-flop rcell memories with different capacities and widths (number of bits).

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as RRAM.

RRAM (Reconfigurable RAM) contains sets of memories of the same type that are placed compactly within a memory matrix. An RRAM, as the term is used herein, is a megacell that can be considered as a set of memories with built-in self testing and built-in self correction. RRAM also contains sets of embedded tools that are used for mapping arbitrary logical customer memory designs to the physical memories in the matrix.

In an RRAM design process, the customer memories (memories specified in the customer design) are mapped to memories of one of the four following types:

1. RRAM,
2. single memory,
3. rcell memory, and
4. flip-flop rcell memory.

Flip-flop rcell memory is memory that is built from flip-flops and logic cells only. In comparison with the other three types of memory, flip-flop rcell memory has two important advantages:

1. Its timing is better than the timing of other memory types, and
2. when the capacity (number of words) of the customer memory is relatively small, the surface area of the integrated circuit required for a flip-flop rcell memory is less than the surface area required by the other memory types.

The present invention is directed toward an RRAM flip-flop memory generator. This generator creates flip-flop rcell memories with different capacities and widths (number of bits).

SUMMARY

The above and other needs are met by an RRAM flip-flop rcell memory of the type having a write address decoder, a read address decoder, a set of n flip flops, one AND gate associated with each flip flop in the set, a set of w OR gates where each of the w OR gates in the set has n inputs, the improvement comprising only one write address decoder, and replacing the read address decoder and the set of AND gates and the set of OR gates with no more than one multiplexor, thereby providing a reduction in a path length from an rcell memory input to an rcell memory output and thereby improving timing of the rcell memory, while reducing fanout size of the rcell. In a preferred embodiment, the multiplexor includes fewer than w OR gates, and fewer than n AND gates, and two decoders, which are commonly connected to outputs of the n flip flops.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

An example is used of a customer memory with width w and capacity n. Denote:

$$k = \rceil \log n \lceil$$

where $\rceil a \lceil$ means the smallest integer number that is not less then a.

Figure 1:
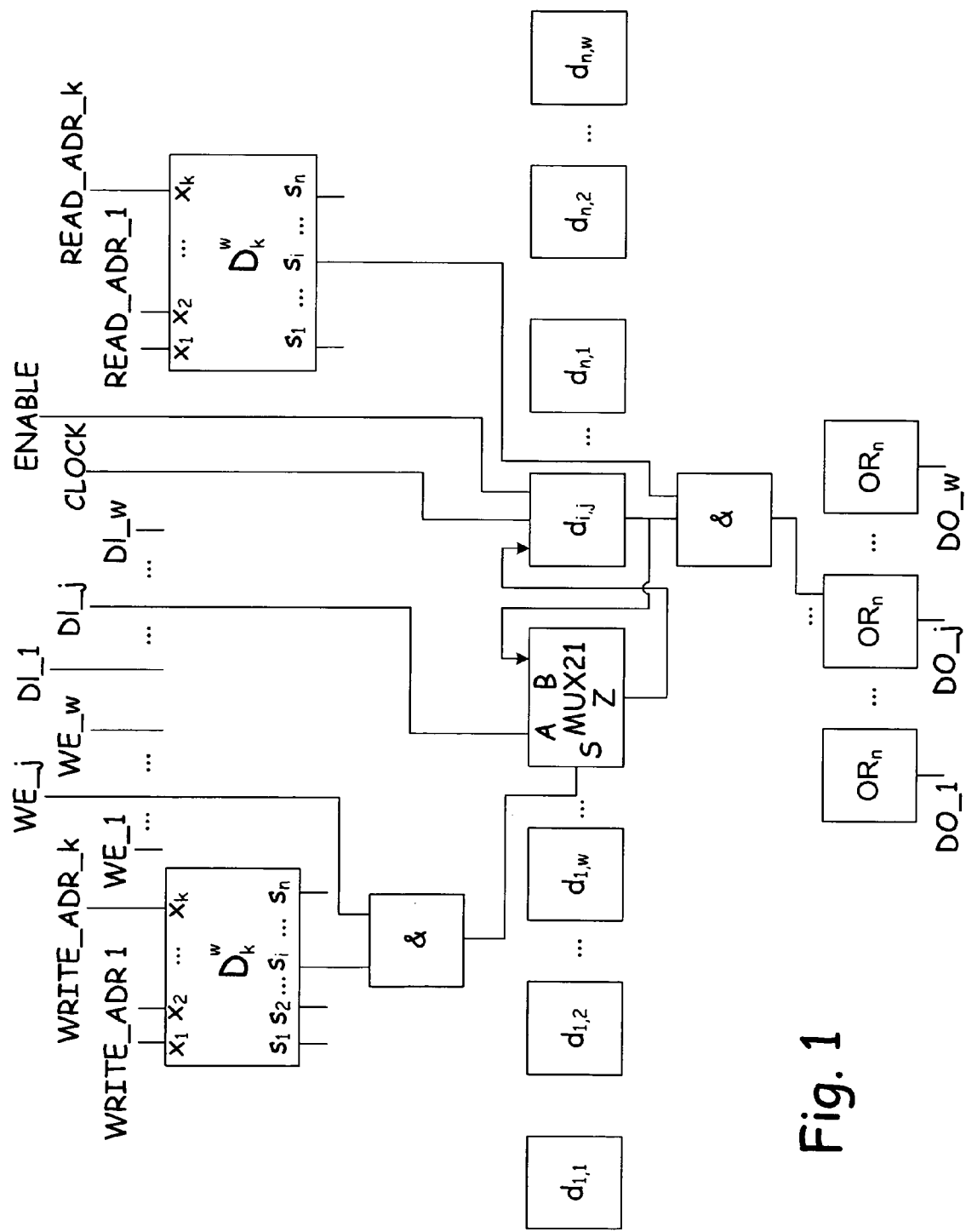
FIG. 1 is a construction diagram for a memory according to a first embodiment.

One approach to the construction of the memory is shown in FIG. 1. This memory consists of flip-flops $d_{1,1}, d_{1,2}, \ldots d_{1,w}, \ldots d_{n,1}, d_{n,2}, \ldots d_{n,w}$ and some logic modules. There are inputs CLOCK, ENABLE, WE_1, ... WE_w, WRITE_ADR_1, ... WRITE_ADR_k, DI_1, ... DI_w, READ_ADR_1, ... READ_ADR_k and outputs DO_1, ... DO_w. $OR_n$ is n-input OR, & is 2-input AND, module $D_k^w$ is a decoder with inputs $x_1, \ldots x_k$ and outputs $s_1, \ldots s_n$, that evaluates logical function $s_i = x_1^{a1} x_2^{a2} \ldots x_k^{ak}$, for each i=1,2...n, the notation $x_j^{aj}$ means "not $(x_j)$" if aj=0, and "$x_j$" if aj=1, where:

$$i - 1 = \sum_{j=1}^{k} a_j * 2^j$$

FIG. 1 illustrates connections of some flip-flop with indexes i,j (i=1,2, ... n and j=1,2 ... w) with inputs, outputs, and logical modules of the memory. All the flip-flops are connected in the same way.

Usually, customer memory that is mapped into flip-flop rcell memory has relatively small capacity and relatively big width. The scheme that is shown in FIG. 1 has two disadvantages:

1. Big fanout on the outputs of decoders, and
2. the length of the path from input READ_ADR_i to data output DO_j is 2]log n[+1.

Thus, in a further embodiment there is described a method of construction of flip-flop rcell memory that allows a reduction in the length of the path from the input READ_ADR_i to the data output DO_j (thus improving timing) to about 1.3]log n[and generally avoids big fanouts. There is a constant C provided by the method, which limits the fanout.

Figure 2:
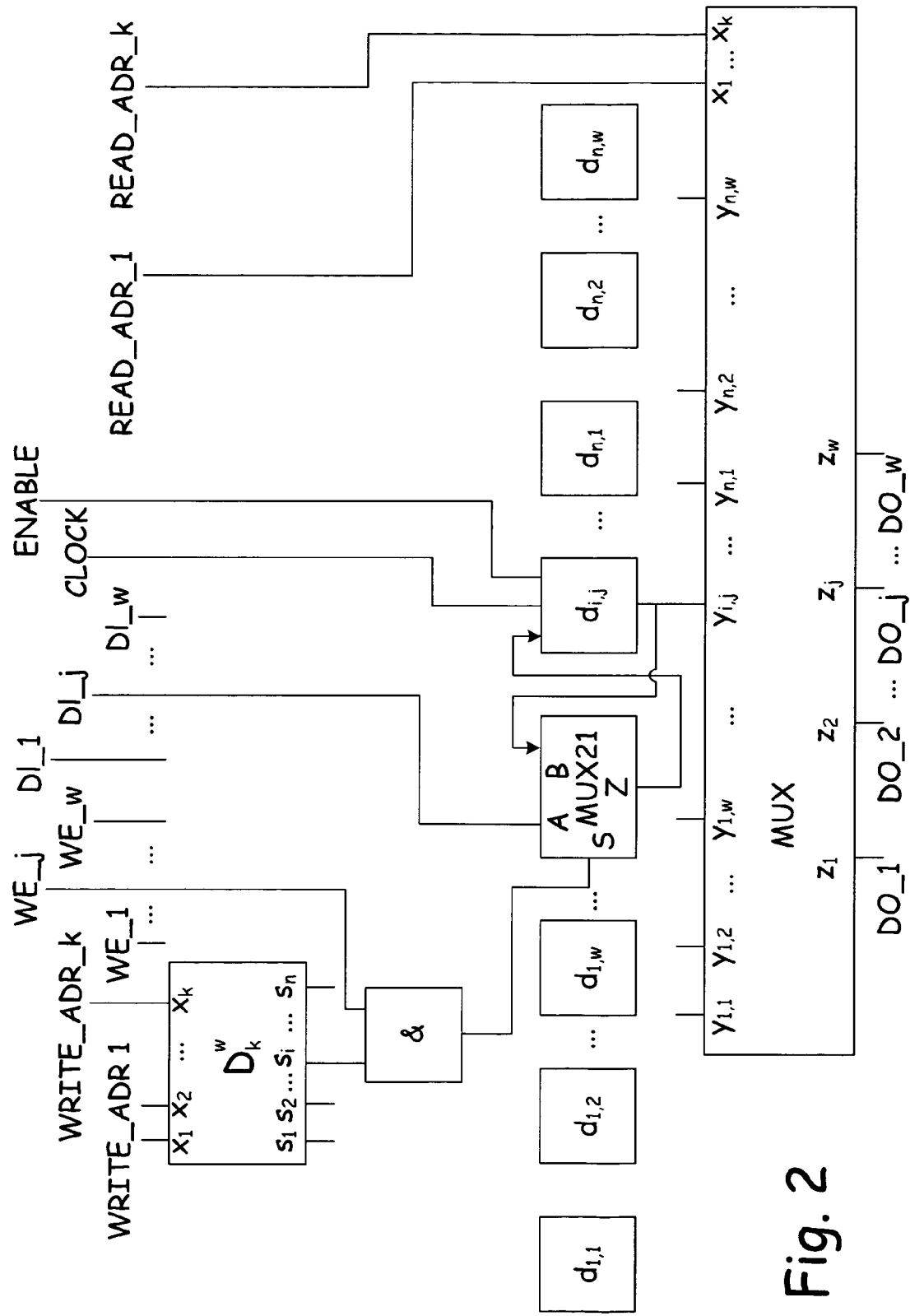
FIG. 2 is a construction diagram for a memory according to a second embodiment that allows a reduction in the length of the path from the input to the output.

The general scheme of the method is shown in FIG. 2. There are inputs CLOCK, ENABLE, WE_1, ... WE_w, WRITE_ADR_1, ... WRITE_ADR_k, DI_1, ... DI_w, READ_ADR_1 ... READ_ADR_k and outputs DO_1, ... DO_w. Module $D_k^w$ is a decoder like the one shown in FIG. 1, & is a 2-input AND, MUX is a "wide" multiplexer with control inputs $x_1, \ldots x_k$ for address, "wide" w-bit inputs $y_1, y_2, \ldots y_n$, (each "wide" w-bit input $y_i$ is presented by w 1-bit inputs $y_{i,1}, y_{i,2}, \ldots y_{i,w}$) for data and wide output z (which is represented by 1-bit outputs $z_1, \ldots z_w$). FIG. 2 illustrates the connections of a flip-flop with indexes i,j (i=1,2, ... n and j=1,2 ... w) with inputs, outputs, and logical modules of the memory. All the other flip-flops are connected in the same way.

Figure 3:
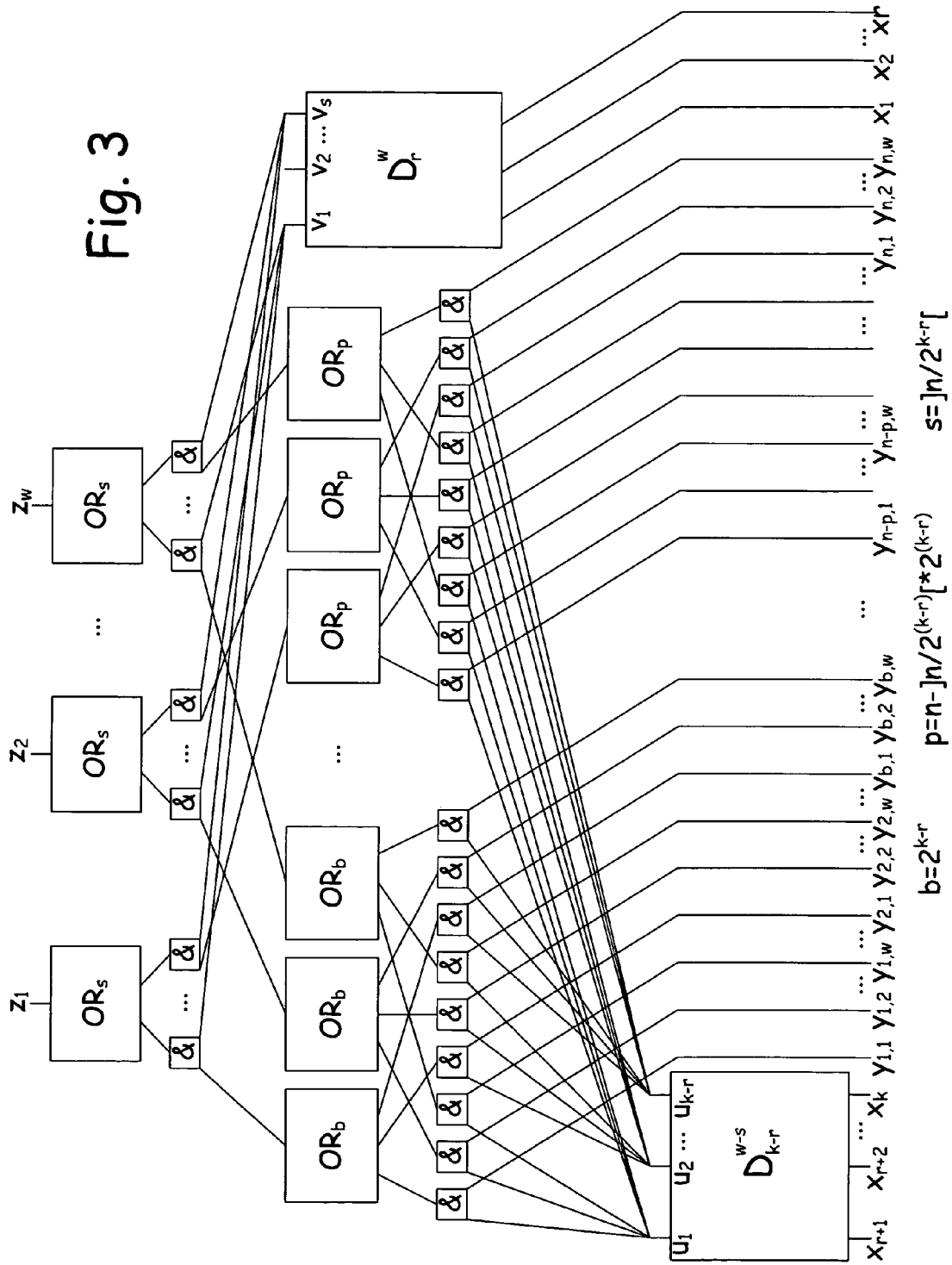
FIG. 3 depicts the netlist of the special wide MUX of FIG. 2.

In this manner, a significant reduction of depth due to the method of the construction of the MUX is achieved. The term "depth" means the maximum length of path that connects some input of the module with some output. FIG. 3 depicts the netlist of the special wide MUX. There are control inputs $x_1, \ldots x_k$ for addressing, 1-bit data inputs $y_{i,1}, y_{i,2}, \ldots y_{i,w}$, i=1,2 ... n for data, and outputs $z_1, \ldots z_w$. Denote:

$$b=2^{(k-r)}, p=n-(]n/2^{(k-r)}[-1]*2^{(k-r)}$$

where [a] means the biggest integer number that is not more than a, $$s=]n/2^{(k-r)}[$$

Modules $OR_b$, $OR_p$ and $OR_s$ are modules OR with b, p, and s inputs correspondingly. The functionality of the proposed module can be described with the following equations:

$$z_j = \underset{t=1}{\overset{s}{OR}}\left[v_t \& \underset{\substack{q=(t-1)*b+1 \\ t=1}}{\overset{t*b-e(t)}{OR}}(u_{(q-(t-1)*b)} \& y_{(q,j)})\right]$$

where j=1, 2 ... w, e(t)=0 if t<s and e(t)=t*b−n if t=s. By means of a choice of r it is possible to achieve a minimum on depth (it is also a goal to minimize the area). The depth of the MUX=max{2k−r+2, 2r+1}. To minimize the depth, r=[(2k+1)/3].

A significant problem appears when there is too large of a fanout of the outputs of the decoders and the nets inside it. Fanout preferably does not exceed some limit C. One approach to avoid this is to replace large fanouts by trees of repeaters (buffers and inverters), but this approach increases the depth of the netlist.

Figure 4:
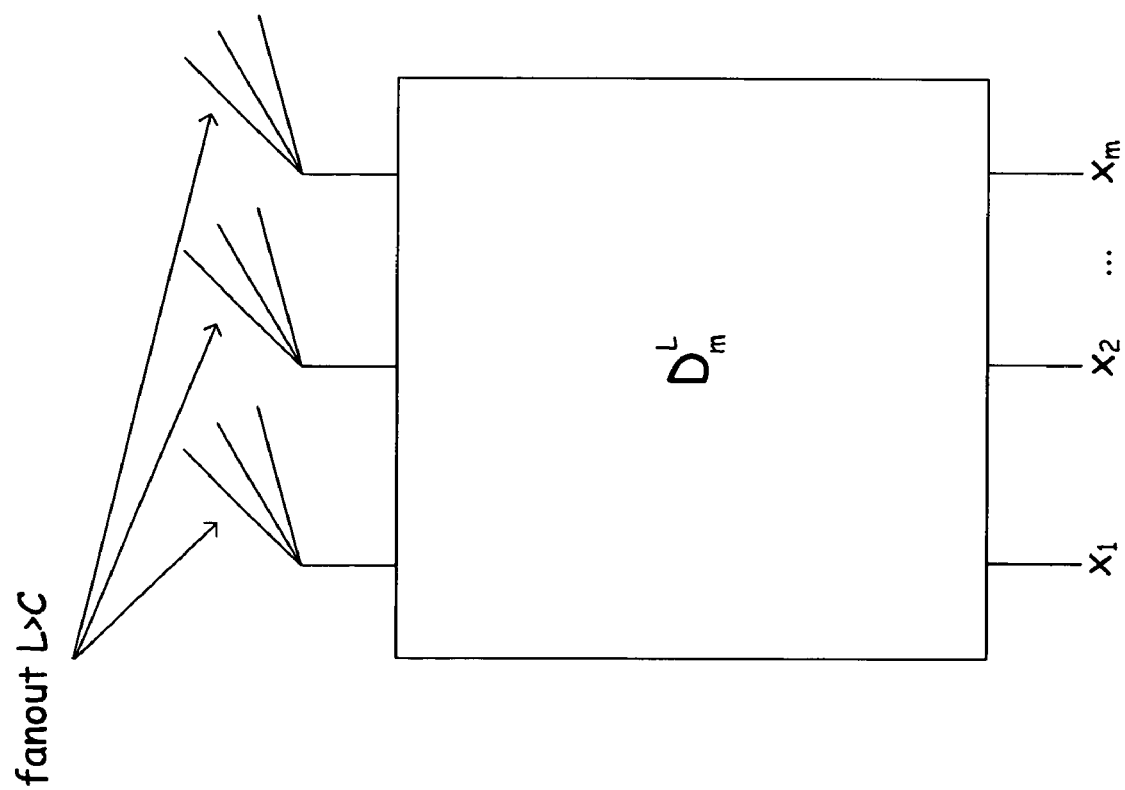
FIG. 4 depicts the decoder of FIG. 2.
Figure 5:
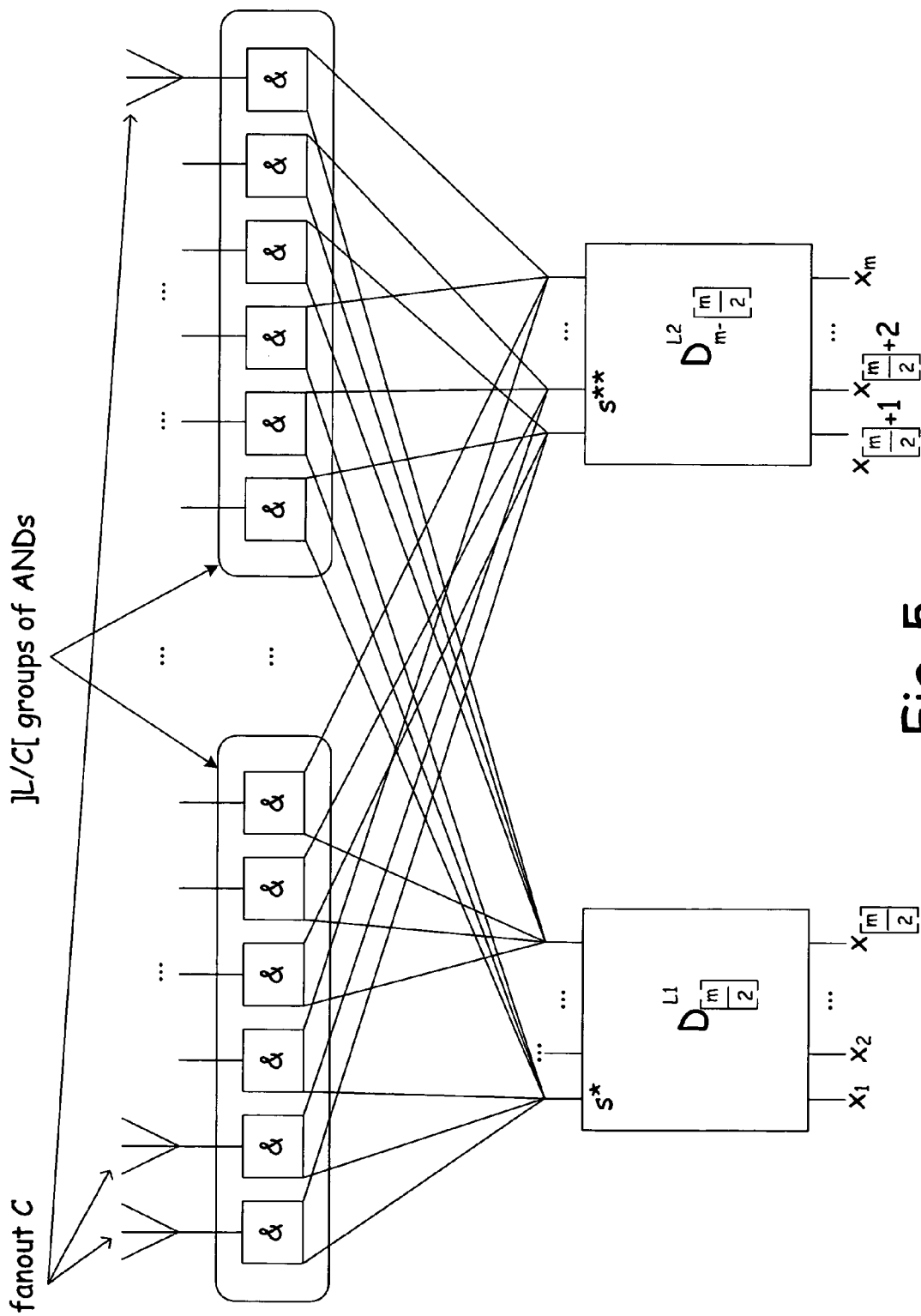
FIG. 5 depicts the results of the process of recursive duplication to the decoder of FIG. 4.

A better approach is the uniform distribution of the fanouts of the decoder wires. Consider decoder $D^L_m$ with m inputs, as depicted in FIG. 4. Let L be the fanout of the outputs of decoder $D^L_m$. Decoder $D^L_m$ consists of decoder $D^{L1}_{[m/2]}$ and decoder $D^{L2}_{m-[m/2]}$. Every output $s_i = x_1^{a1} x_2^{a2} \ldots x_m^{am}$ of the decoder $D^L_m$ is obtained as an AND of the output s' of the decoder $D^{L1}_{[m/2]}$ and output s" of the decoder $D^{L2}_{m-[m/2]}$, where $s'=x_1^{a1} x_2^{a2} \ldots x_{[m/2]}^{a[m/2]}$ and $s''=x_{[m/2]+1}^{a[m/2]+1} x_{[m/2]+2}^{a[m/2]+2} \ldots x_m^{am}$ (the notation $x_i^{ai}$ is defined above). Decoders $D^{L1}_{[m/2]}$ and $D^{L2}_{m-[m/2]}$ are built like decoder $D^L_m$, recursively. If L>C, then there is applied to the decoder $D^L_m$ a step shown in FIG. 5. We duplicate a layer of ANDs]L/c[times. Denote the fanouts of the outputs of the decoders $D^{L1}_{[m,2]}$ and $D^{L2}_{m-[m/2]}$ to be $L_1$ and $L_2$, respectively. Further, the same procedure is recursively applied to the decoders $D^{L1}_{[m/2]}$ and $D^{L2}_{m-[m/2]}$. From this it is found that $L_1=]L/c[*2^{m-[m/2]}$ and $L_2=]L/c[*2^{[m/2]}$.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In an RRAM flip-flop rcell memory of the type having a write address decoder, a read address decoder, a set of n flip flops, one AND gate associated with each flip flop in the set, a set of w OR gates where each of the w OR gates in the set has n inputs, the improvement comprising:
   only one write address decoder, and
   replacing the read address decoder and the set of AND gates and the set of OR gates with no more than one multiplexor,
   thereby providing a reduction in a path length from an rcell memory input to an rcell memory output and thereby improving timing of the rcell memory, while reducing fanout size of the rcell.

2. The rcell memory of claim 1, wherein the multiplexor includes fewer than w OR gates, and fewer than n AND gates, and two decoders, which are commonly connected to outputs of the n flip flops.

* * * * *